METHOD OF FORMING LARGE AREA PN JUNCTIONS

Filed March 23, 1955

INVENTOR
W. SHOCKLEY
BY
Arthur J. Torsiglieri
ATTORNEY 2,868,678

METHOD OF FORMING LARGE AREA PN JUNCTIONS

William Shockley, Madison, N. J., assignor to Bell Telephone Laboratories, Incorporated, New York, N. Y., a corporation of New York Application March 23, 1955, Serial No. 496,201

5 Claims. (Cl. 148—1.5)

Figures 1, 2:
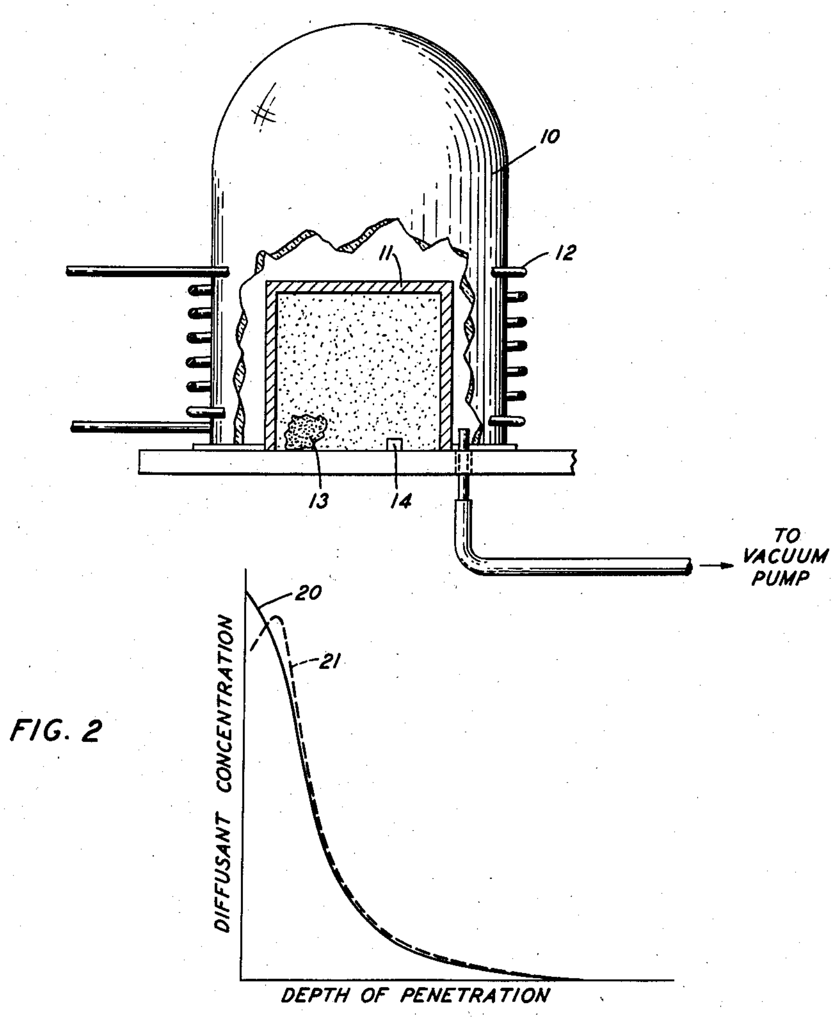

The present invention relates to the manufacture of semiconductive devices and more particularly to a method for forming surface layers of a given conductivity type and resistivity on semiconductive bodies to be used in semiconductive devices.

A broad object of the invention is to facilitate the formation of surface layers of prescribed characteristics on semiconductive bodies.

The formation of a surface layer of prescribed characteristics on the surface of a semiconductive body is becoming of increasing importance as a technique for providing a large area rectifying junction in the body. Various techniques have been suggested hitherto for the conversion of the conductivity type of a surface portion of a semiconductive body in order to form a rectifying junction in the body. One of the most promising techniques is that described in United States Patent 2,567,970 which issued on September 18, 1951, to J. H. Scaff and H. C. Theuerer. This technique involves the heating of a p-type silicon body in the presence of the vapor given off in the heating of yellow phosphorus for the diffusion of phosphorus into the silicon body for forming a phosphorus-diffused surface layer of n-type conductivity, whereby there is formed in the silicon body a rectifying p-n junction.

However, this technique in this form is of limited applicability since its application is in a practical sense limited to use with particular diffusants characterized by vapor pressures in the narrow range in which such diffusion is easily controlled. This is unfortunate since some of the significant impurities of greatest promise as diffusants from other considerations, such as arsenic for use in converting p-type germanium to n-type, are characterized by such high vapor pressures in their pure state at temperatures in which they will readily diffuse into a semiconductive body that control of the concentration of the diffusant introduced becomes difficult. In particular, for applications of the kind to be discussed in more detail hereinafter in which it becomes necessary to reconvert subsequently a surface portion of the diffused layer which has been formed to a conductivity type opposite that of the diffused layer, it is desirable to limit the concentration of the original diffusant at the surface of the diffused layer whereby the subsequent reconversion may be more readily carried out. The term "significant impurity" as used in the specification means a conductivity type determining impurity.

To overcome this shortcoming in the process described and to provide greater flexibility to the diffusion technique, it is in accordance with the present invention to dilute the significant impurity element to be used as the diffusant in a suitable carrier in a manner to reduce its effective vapor pressure to a suitable value. However, it is important that the carrier employed be one which itself will not result in contamination of the semiconductive body being treated. Moreover, when a carrier is used there is created the problem of control. It is extremely important in many applications of this technique to control accurately the various parameters involved whereby reproducibility is enhanced and prescribed characteristics readily achieved. In particular, it is important when large quantities of semiconductive bodies are to be prepared necessitating a number of runs to be able to ascertain conveniently the concentration of the significant impurity element used as the diffusant in the carrier at periodic intervals to insure that it is within a prescribed range. Additionally, it is advantageous from a production standpoint if the concentration of the significant impurity diffusant in the carrier can readily be kept uniform in a large number of "doping charges" (the term to be used in designating the mixture of the carrier and the significant impurity diffusant).

To these ends, it is in accordance with a related feature of the invention to employ in a doping charge as the carrier semiconductive material of high purity and economically of polycrystalline form. Advantageously, the semiconductor forming the carrier in the doping charge is the same semiconductor as that of the body to be treated. By this expedient, there is minimized the problem of contamination and additionally there is facilitated the problem of control. Control is facilitated because the concentration of the significant impurity element in such a doping charge can be readily ascertained by a simple resistivity measurement of the doping charge, since there will exist a definite relation between the resistivity of the doping charge and the concentration of the significant impurity therein.

An application typical of those in which the invention finds use is the fabrication of junction transistors in accordance with the processes described in a copending application Serial No. 496,202, filed March 23, 1955, by G. C. Dacey, C. A. Lee and W. Shockley. In a preferred embodiment of such processes, a surface layer of a p-type germanium body is converted to n-type by the diffusion therein of arsenic atoms and the major portion of this layer serves as the base zone of a transistor. However, a surface portion of this n-type zone is reconverted to p-type for use as the emitter zone by the evaporation and subsequent alloyage of an aluminum film on the arsenic-diffused layer. For the success of this process it is important to control to a high degree of accuracy the characteristics of the surface of the layer formed by the diffusion of arsenic atoms. In particular, it is necessary to limit the concentration of arsenic atoms in the surface of the diffused layer to approximately $2\times10^{17}$ atoms/cm.$^2$. To this end, it has been found advantageous in that process to form the arsenic-diffused surface layer in accordance with the present invention.

In a specific embodiment of the present invention for particular use in the process just described, a p-type germanium wafer is heated under prescribed conditions in a clean molybdenum oven which also includes as a doping charge a mass of polycrystalline n-type germanium in which there is present a prescribed concentration of arsenic.

The invention will be understood more clearly from the following more detailed description taken in conjunction with the accompanying drawings in which:

Fig. 1 shows an oven in which there is being heated a semiconductive wafer in the presence of a doping charge of semiconductive material in accordance with the invention; and Fig. 2 shows the relative concentration of diffusant with increasing penetration into a semiconductive wafer after treatment in accordance with the invention.

With reference now more particularly to the drawings, in Fig. 1 there is represented in schematic form equipment suitable for implementing one embodiment of the invention. Within a chamber 10, which, for example, is of some refractory material such as quartz which provides a minimum of undesirable impurities when heated, there is positioned, suitably supported, an oven 11 which preferably is of molybdenum or other suitable material which can readily be cleaned of significant impurities, particularly copper. Provision is made for evacuating the chamber 10 and therewith the oven 11. Induction coils 12 to which are applied radio frequency currents surround the chamber 10 for heating the interior of the oven. Suitable temperature measuring apparatus (not shown) is provided for use in regulating the temperature of the oven. Within the oven, there is provided a doping charge 13 which, in a preferred embodiment of the invention, comprises a mass of polycrystalline germanium which includes arsenic as a dilutant but is otherwise highly purified. Typically, the germanium mass may be diluted with a concentration of arsenic of approximately $10^{19}$ atoms per cubic centimeter, which at room temperature corresponds to a resistivity of .002 ohm-centimeter for the doping charge.

The oven also includes a germanium wafer 14, advantageously of monocrystalline material, and typically of p-type conductivity produced by adding gallium as a doping agent to the germanium melt during crystal growing. Advantageously, the germanium wafer 14 has been treated to minimize surface impurities, particularly copper. Typically, such treatment includes surface polishing and soaking in potassium cyanide in the manner described in United States Patent No. 2,698,780, which issued on January 4, 1955, to R. A. Logan and M. Sparks.

For forming the desired arsenic-diffused surface layer on the germanium wafer, the oven is evacuated and then it and its contents are heated to a temperature and for a time which is determined by the properties desired for the diffused layer.

The concentration of arsenic diffused into the surface of the germanium sample can be controlled by the arsenic concentration of the doping charge. The doping charge ordinarily will have a mass large compared to that of the wafer being treated. The operating oven temperature controls the rate at which arsenic diffuses in the germanium wafer which, together with the heating time, determines the depth of diffusion of the arsenic into the germanium wafer. For the typical doping charge of the kind described, a heating time of about fifteen minutes at a temperature of approximately 800° C. provides in a p-type germanium wafer originally of 5 ohm-centimeter resistivity an n-type arsenic-diffused layer .18 mil deep having a surface concentration of arsenic of approximately $2\times10^{17}$ atoms/cubic centimeter and a surface conductivity approximately $10^{-2}$ mho/centimeter$^2$.

It is characteristic of a diffusion process of this kind that it produces in the semiconductive wafer a gradient in the concentration of the diffusant in the diffused layer which has the characteristic of a complementary error function. In Fig. 2 there is plotted as the solid line 20 the relative concentration of diffusant against the depth of penetration of the diffusant provided by the technique described.

Variations from such a distribution may be readily achieved. By successive diffusion cycles which use doping charges diluted with different concentrations of the impurity there is provided control of the concentration gradient. For example, the concentration resulting at the surface of the diffused layer of the wafer by a first cycle may be reduced by a second cycle utilizing a doping charge of relatively lower impurity concentration. For some applications, such a second cycle might take place even in an atmosphere free of diffusant vapor such as will be provided if the doping charge is of intrinsic semiconductive material, to provide a surface portion in which the diffusant concentration is relatively low. This results in the peak value of the diffusant concentration being shifted to a region slightly in from the surface as shown by the broken line 21 in Fig. 2. Such a technique is particularly useful for applications in which it is desired to reconvert the conductivity type of a surface portion of the diffused layer for use as an emitter zone in a junction transistor as described in the copending application of G. C. Dacey, C. A. Lee and W. Shockley identified above.

As indicated briefly above, the carrier used in the doping charge to reduce the vapor pressure of a diffusant need not necessarily be a semiconductor, although such a choice provides the advantages set forth. Alternatively, for reasons of economy the diffusant may be diluted in other suitable carrier materials, such as lead or tin, which will not contaminate undesirably the wafer being treated.

It is generally desirable for the mass of the doping charge to be larger than that of the wafer being treated. In some instances, it may be advantageous to have the wafer heated in an oven which is lined with or formed of material suitable for serving as the doping charge, such as polycrystalline germanium appropriately diluted with arsenic but otherwise of high purity.

The techniques described may readily be applied to the formation of diffusion layers of extrinsic conductivity type on wafers of intrinsic material. Additionally, they may be employed for forming diffusion layers of a given resistivity characteristic of the same extrinsic conductivity type on an extrinsic semiconductive wafer.

For applications where a plurality of rectifying junctions in a single wafer are desired, it is feasible to employ a succession of diffusion cycles in which significant impurities characteristic of different conductivity types are used as diffusants in successive cycles. In such a process, a surface portion of the last-formed diffused layer has its conductivity type reconverted by the succeeding diffusion cycle. Alternatively, to this same end other techniques, such as fusion involving recrystallization, may be used for reconverting the conductivity type of surface portions of the newly formed diffused layer.

It is feasible, of course, to employ as the diffusant various different significant impurities. Other donor elements that may be used in this way are phosphorus, antimony, and bismuth. Acceptor elements that can be used for forming p-type layers include aluminum, indium, and gallium. Additionally, the practice of the invention is not limited to the treatment of germanium wafers, but may be extended to use with various other known semiconductors, such as silicon, germanium-silicon alloys, and the group III-group V compounds, such as indium antimonide and aluminum arsenide.

Accordingly, the specific process described in detail is to be taken only as illustrative of the general principles of the invention. Various modifications may be made therein without departing from the spirit and scope of the invention.

What is claimed is:

1. A vapor-solid diffusion method for producing a region of altered electrical characteristics in a monocrystalline semiconductive body which extends inwardly from the surface of said body comprising the steps of placing said body into an evacuated and substantially closed system, placing into said system a mass which is large relative to said body and which mass consists essentially of said semiconductive material and a significant impurity, heating said body and said mass to a temperature for causing said significant impurity to vaporize, and maintaining said mass and said body at said temperature for a time necessary to produce said region, in accordance with which method deposition of significant impurity on the surface of the said body is substantially avoided.

2. The method in accordance with claim 1 wherein the monocrystalline body is of one conductivity type and wherein the said significant impurity imparts opposite conductivity type.

3. The method in accordance with claim 1 wherein the semiconductive body comprises germanium.

4. The method in accordance with claim 3 wherein said mass consists essentially of germanium and arsenic, the concentration of arsenic in said mass being about $10^{19}$ atoms per cubic centimeter, wherein the temperature to which said body and said mass is heated is about 800° C., and wherein the prescribed concentration of arsenic in the surface portion of said region is $2\times10^{17}$ atoms per square centimeter.

5. The method in accordance with claim 4 wherein said semiconductive body consists of p-type germanium of about 5-ohm centimeter resistivity.

References Cited in the file of this patent

UNITED STATES PATENTS

| | | |
|---|---|---|
| 2,629,672 | Sparks | Feb. 24, 1953 |
| 2,644,852 | Dunlap | July 7, 1953 |
| 2,692,839 | Christensen et al. | Oct. 26, 1954 |
| 2,695,852 | Sparks | Nov. 30, 1954 |
| 2,701,216 | Seiler | Feb. 1, 1955 |
| 2,731,366 | Weinrich | Jan. 17, 1956 |
| 2,736,847 | Barnes | Feb. 28, 1956 |
| 2,739,088 | Pfann | Mar. 20, 1956 |